(12) United States Patent
Ogata et al.

(10) Patent No.: US 11,287,741 B2
(45) Date of Patent: Mar. 29, 2022

(54) RESIST UNDERLAYER FILM-FORMING COMPOSITION

(71) Applicant: NISSAN CHEMICAL CORPORATION, Tokyo (JP)

(72) Inventors: Hiroto Ogata, Toyama (JP); Yuto Hashimoto, Toyama (JP); Mamoru Tamura, Toyama (JP); Takahiro Kishioka, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 241 days.

(21) Appl. No.: 16/605,246

(22) PCT Filed: Apr. 27, 2018

(86) PCT No.: PCT/JP2018/017314
§ 371 (c)(1),
(2) Date: Oct. 15, 2019

(87) PCT Pub. No.: WO2018/203540
PCT Pub. Date: Nov. 8, 2018

(65) Prior Publication Data
US 2020/0201184 A1 Jun. 25, 2020

(30) Foreign Application Priority Data
May 2, 2017 (JP) .............. JP2017-092008

(51) Int. Cl.
*G03F 7/11* (2006.01)
*C08G 59/30* (2006.01)
(Continued)

(52) U.S. Cl.
CPC .............. *G03F 7/11* (2013.01); *C08G 59/302* (2013.01); *C09D 163/00* (2013.01);
(Continued)

(58) Field of Classification Search
CPC ................ C09D 171/02; C09D 163/00; C08G 65/3322; C08G 65/2609; C08G 59/302;
(Continued)

(56) References Cited

U.S. PATENT DOCUMENTS 5,677,380 A * 10/1997 Matsumura .......... C09D 133/06
427/340
5,886,102 A 3/1999 Sinta et al.
(Continued)

FOREIGN PATENT DOCUMENTS

JP  H05-202228 A  8/1993
JP  2007-099943 A  4/2007
(Continued)

OTHER PUBLICATIONS

Jul. 31, 2018 Written Opinion issued in International Patent Application No. PCT/JP2018/017314.
(Continued)

*Primary Examiner* — Caleen O Sullivan
(74) *Attorney, Agent, or Firm* — Oliff PLC

(57) ABSTRACT

A composition for forming a resist underlayer film that functions as an anti-reflective coating during exposure and can be embedded in a recess having a narrow space and a high aspect ratio, and has excellent resistance to an aqueous hydrogen peroxide solution. A resist underlayer film-forming composition containing a resin, a compound of the following Formula (1a) or (1b):

(1a)

(Continued)

-continued

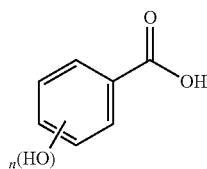
(1b)

wherein X is carbonyl group or methylene group, l and m are each independently an integer of 0 to 5 and satisfy a relational expression of 3≤l+m 10, and n is an integer of 2 to 5, and a solvent, wherein the compound of Formula (1a) or (1b) is contained in an amount of 0.01% by mass to 60% by mass relative to the amount of the resin.

6 Claims, 2 Drawing Sheets

(51) Int. Cl.
*C09D 163/00* (2006.01)
*H01L 21/027* (2006.01)
*H01L 21/311* (2006.01)
*H01L 21/306* (2006.01)
*H01L 21/308* (2006.01)

(52) U.S. Cl.
CPC ...... *H01L 21/0273* (2013.01); *H01L 21/3081* (2013.01); *H01L 21/3086* (2013.01); *H01L 21/30604* (2013.01); *H01L 21/31111* (2013.01); *H01L 21/31138* (2013.01); *H01L 21/31144* (2013.01)

(58) Field of Classification Search
CPC .......... C08G 65/33317; C08G 65/3344; C08K 5/13; C08K 5/138; G03F 7/168; G03F 7/11; G03F 7/091; G03F 7/094; H01L 21/027; H01L 21/306; H01L 21/02043; H01L 21/0273; H01L 21/30604; H01L 21/3081; H01L 21/3086; H01L 21/31111; H01L 21/31138; H01L 21/31144; H01L 21/0271
USPC ........................ 430/270.1, 271.1, 272.1, 311
See application file for complete search history.

(56) References Cited

U.S. PATENT DOCUMENTS

| 6,033,830 | A | 3/2000 | Sinta et al. |
| 2015/0200091 | A1 | 7/2015 | Chada et al. |
| 2016/0218013 | A1* | 7/2016 | Ohashi .............. H01L 21/30604 |

FOREIGN PATENT DOCUMENTS

| JP | 4145972 B2 | 9/2008 |
| JP | 2017-511780 A | 4/2017 |
| WO | 2005/013601 A1 | 2/2005 |
| WO | 2009/096340 A1 | 8/2009 |
| WO | 2015/030060 A1 | 3/2015 |
| WO | 2015/098525 A1 | 7/2015 |
| WO | 2018/052130 A1 | 3/2018 |

OTHER PUBLICATIONS

Jul. 31, 2018 Search Report issued in International Patent Application No. PCT/JP2018/017314.

* cited by examiner

RESIST UNDERLAYER FILM-FORMING COMPOSITION

TECHNICAL FIELD

The present invention relates to a composition for forming a resist underlayer film that functions as an anti-reflective coating during exposure and can be embedded in a recess having a narrow space and a high aspect ratio, and a resist underlayer film (protective film) having excellent resistance to an aqueous hydrogen peroxide solution. Further, the present invention relates to a method for forming a pattern using the resist underlayer film.

BACKGROUND ART

A lithography process in which a resist underlayer film is provided between a substrate and a resist film formed on the substrate and a resist pattern having a desired shape is formed has been known. However, a conventional resist underlayer film, for example, a resist underlayer film formed from a composition containing an aminoplast-based crosslinker that is described in Patent Document 1 described below is less resistant to an aqueous hydrogen peroxide solution. Therefore, such a resist underlayer film cannot be used as a mask in a wet etching process using an aqueous hydrogen peroxide solution.

Patent Document 2 describes an underlayer film-forming composition for lithography containing a compound having a protected carboxyl group, a compound having a group capable of reacting with a carboxyl group, and a solvent, or an underlayer film-forming composition for lithography containing a compound having a group capable of reacting with a carboxyl group and a protected carboxyl group, and a solvent. The compositions do not contain an aminoplast-based crosslinker as an essential component. However, Patent Document 2 does not describe or suggest resistance of resist underlayer films formed from the compositions to an aqueous hydrogen peroxide solution.

Patent Document 3 describes a method for forming a pattern using a resist underlayer film having resistance to a basic aqueous hydrogen peroxide solution. A composition for forming the resist underlayer film contains a polymer having a weight average molecular weight of 1,000 to 100,000 and having an epoxy group, and a solvent.

Patent Document 4 describes a resist underlayer film-forming composition containing a polymer having at least one sulfur atom in a structural unit. When a substrate having a surface having a recess is used in manufacturing of a semiconductor element, a gap-filling material that can be embedded in the recess of the substrate or a flattening film is required. However, Patent Document 4 does not describe or suggest embeddability in the recess.

Patent Document 5 describes a resist underlayer film-forming composition containing a copolymer having a triazine ring and a sulfur atom in a main chain. When the composition described in Patent Document 5 is used, a resist underlayer film that functions as an anti-reflective coating during exposure and can be embedded in a hole (diameter: 0.12 μm, depth: 0.4 μm) of a semiconductor substrate can be obtained.

PRIOR ART DOCUMENTS

Patent Documents

Patent Document 1: Japanese. Patent No. 4145972
Patent Document 2: International Publication No. 2005/013601 (WO 2005/013601)
Patent Document 3: International Publication No. 2015/030060 (WO 2015/030060)
Patent Document 4: International Publication. No. 2009/096340 (WO 2009/096340)
Patent Document 5: International Publication No. 2015/098525 (WO 2015/098525)

SUMMARY OF THE INVENTION

Problem to be Solved by the Invention

In manufacturing of a semiconductor element, a resist underlayer film that satisfies all requirements including functioning as an anti-reflective coating during exposure, filling a recess of a semiconductor substrate, exhibiting resistance to an aqueous hydrogen peroxide solution, and making it possible to form a pattern by being used as a protective film against the aqueous hydrogen peroxide solution is required. However, when the recess is a trench having a narrow space and a high aspect ratio, a conventional resist underlayer film-forming composition is not completely embedded in the recess with ease. In a case of the conventional resist underlayer film-forming composition, pattern formation using the resist underlayer film is not easy.

Means for Solving the Problems

The present invention solves the aforementioned problem by using a resist underlayer film-forming composition containing a resin, a benzophenone derivative, a diphenylmethane derivative, or a benzoic acid derivative having a plurality of phenolic hydroxy groups, and a solvent, wherein the benzophenone derivative, the diphenylmethane derivative, or the benzoic acid derivative is contained in a specific amount relative to the content of the resin component. Herein, the phenolic hydroxy groups mean a hydroxy group bonded to a benzene ring.

A first aspect of the present invention is a resist underlayer film-forming composition containing a resin, a compound of the following Formula (1a) or (1b):

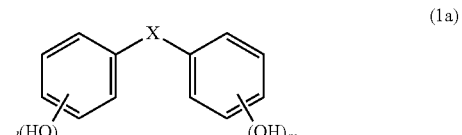

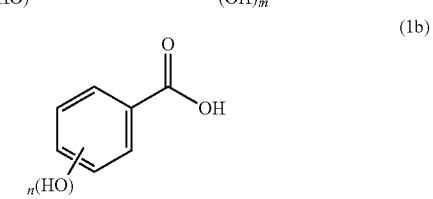

(wherein X is carbonyl group or methylene group, 1 and m are each independently an integer of 0 to 5 and satisfy a relational expression of 3≤1+m≤10, and n is an integer of 2 to 5), and a solvent, wherein the compound of Formula (1a) or (1b) is contained in an amount of 0.01% by mass to 60% by mass relative to the amount of the resin.

It is preferable that the compound of Formula (1a) have a phenolic hydroxy group at two or more adjacent carbon atoms of at least one benzene ring, and the compound of Formula (1b) have a phenolic hydroxy group at two or more adjacent carbon atoms of a benzene ring.

For example, in the compound of Formula (1a), 1 and m are each 3, and in the compound of Formula (1b), n is 3.

The resist underlayer film-forming composition of the present invention may contain a crosslinker. For example, the crosslinker is a nitrogen-containing compound having at least two nitrogen atoms bonded to a hydroxymethyl group or an alkoxymethyl group, an aromatic compound having at least two hydroxymethyl groups or alkoxymethyl groups, a compound having at least two epoxy groups, or a compound having at least two blocked isocyanate groups.

The resist underlayer film-forming composition of the present invention may contain a crosslinking catalyst for promoting a crosslinking reaction. For example, the crosslinking catalyst is a sulfonic acid compound or a carboxylic acid compound, or a thermal acid generator.

The resist underlayer composition of the present invention may further contain a surfactant.

The resin is, for example, a copolymer having no substituent containing an epoxy ring or an oxetane ring.

A second aspect of the present invention is a method for manufacturing a semiconductor element including steps of applying the resist underlayer film-forming composition according to the first aspect of the present invention to a semiconductor substrate having a surface having a recess and optionally having an inorganic film on the surface, baking the resist underlayer film-forming composition to form a resist underlayer film in at least the recess, and forming a resist pattern on the resist underlayer film.

The semiconductor substrate has, for example, a trench having a width of 0.001 μm to 0.10 μm and an aspect ratio of 1 to 10.

A third aspect of the present invention is a method for forming a pattern including steps of forming a resist underlayer film from the resist underlayer film-forming composition according to the first aspect on a semiconductor substrate optionally having an inorganic film on a surface, forming a resist pattern on the resist underlayer film, dry etching the resist underlayer film using the resist pattern as a mask to expose the inorganic film or a surface of the semiconductor substrate, and wet etching the inorganic film or the semiconductor substrate with an aqueous hydrogen peroxide solution using the resist underlayer film after the dry etching as a mask and washing the inorganic film or the semiconductor substrate.

Examples of the aqueous hydrogen peroxide solution include a basic aqueous hydrogen peroxide solution containing ammonia, sodium hydroxide, potassium hydroxide, sodium cyanide, potassium cyanide, triethanolamine, or urea, and an acidic aqueous hydrogen peroxide solution containing hydrochloric acid or sulfuric acid. When the aqueous hydrogen peroxide solution is a basic aqueous hydrogen peroxide solution containing ammonia, the basic aqueous hydrogen peroxide solution is, for example, a mixture of 25% by mass to 30% by mass of aqueous ammonia solution (A), 30% by mass to 36% by mass of aqueous hydrogen peroxide solution (B), and water (C), the volume ratio (B)/(A) of the aqueous hydrogen peroxide solution (B) to the aqueous ammonia solution (A) is 0.1 to 20.0, and the volume ratio (C)/(A) of water (C) to the aqueous ammonia solution (A) is 0.1 to 50.0.

Effects of the Invention

A resist underlayer film formed from the resist underlayer film-forming composition of the present invention has resistance to an aqueous hydrogen peroxide solution. Therefore, the resist underlayer film (protective film) formed from the resist underlayer film-forming composition of the present invention can be used as a mask in an etching process with the aqueous hydrogen peroxide solution and a washing process.

The resist underlayer film formed from the resist underlayer film-forming composition of the present invention contains a benzophenone derivative or a benzoic acid derivative that have a plurality of phenolic hydroxy groups. When such a resist underlayer film-forming composition is used, a resist underlayer film that functions as an anti-reflective coating during exposure and can be completely embedded in a trench having a narrow space and a high aspect ratio is obtained. "Completely embedded" used herein means a state where a void (gap) is not observed in a trench whose inside is filled with a resist underlayer film in observation of a cross-section with a scanning electron microscope (SEM).

MODES FOR CARRYING OUT THE INVENTION

Figure 1:
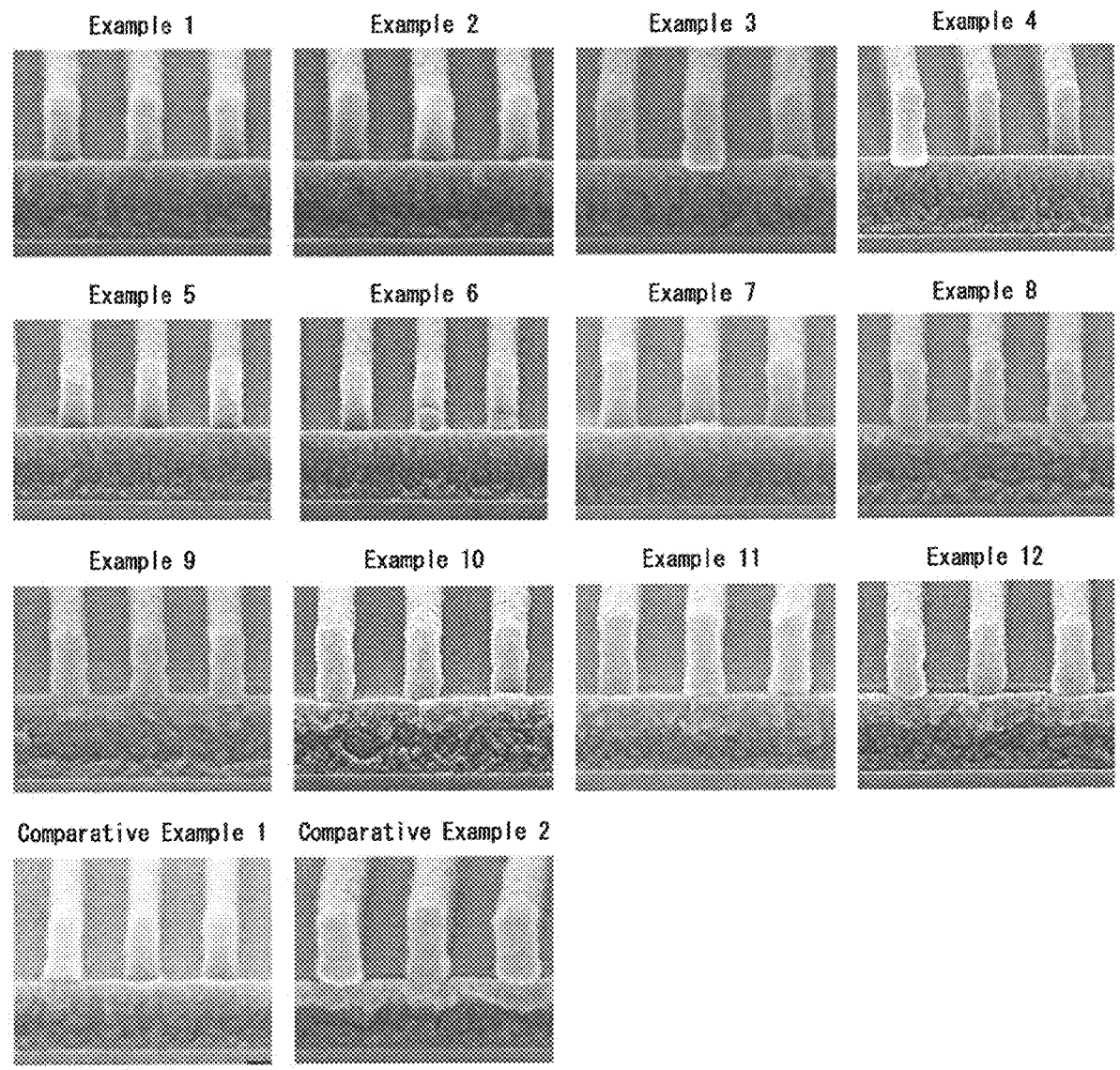
FIG. 1 is cross-sectional SEM images of photoresist patterns formed on resist underlayer films formed from resist underlayer film-forming compositions prepared in Examples 1 to 12, and Comparative Examples 1 and 2.

Hereinafter, components contained in a resist underlayer film-forming composition of the present invention will be described in detail.

[Resin]

The resist underlayer film-forming composition of the present nvention contains a resin as an essential component. Examples of the resin include, but not particularly limited to, a polyester, a polyether, a novolac resin, a maleimide resin, an acrylic resin, and a methacrylic resin. As the resin, a copolymer having no substituent containing an epoxy ring or an oxetane ring is preferably used. Examples of the substituent containing an epoxy ring or an oxetanyl group include a glycidyl group and an oxetanyl group.

[Compound of Formula (1a) or (1b)]

The resist underlayer film-forming composition of the present invention contains a compound of Formula (1a) or (1b) as an essential component. Examples of the compound of Formula (1a) include compounds of Formula (1a-1) to (1a-20) described below.

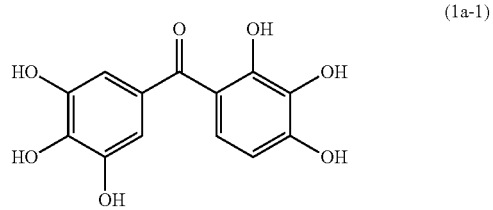

(1a-1)

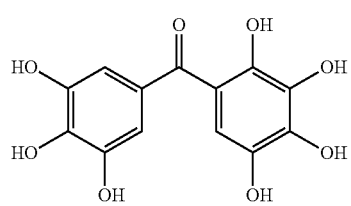 (1a-2)
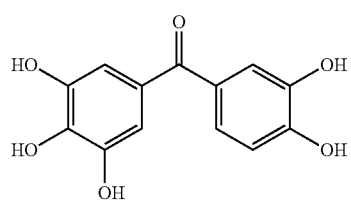 (1a-3)
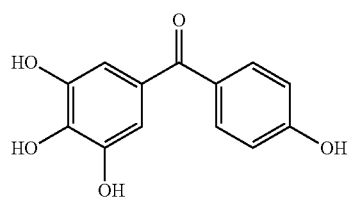 (1a-4)
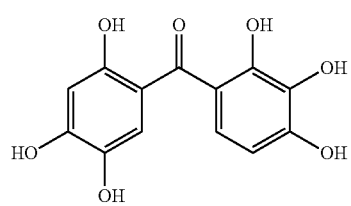 (1a-5)
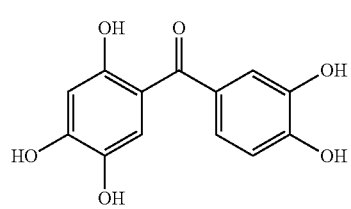 (1a-6)
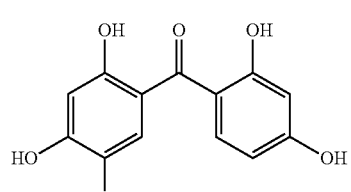 (1a-7)
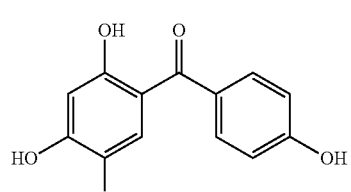 (1a-8)
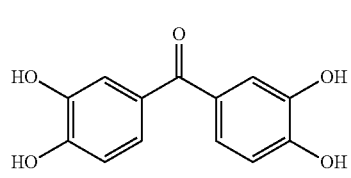 (1a-9)
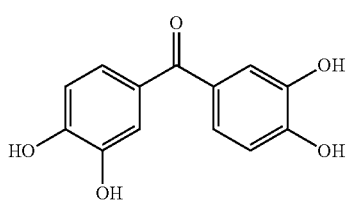 (1a-10)
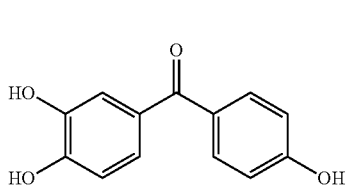 (1a-11)
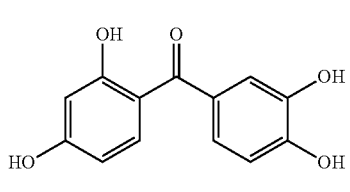 (1a-12)
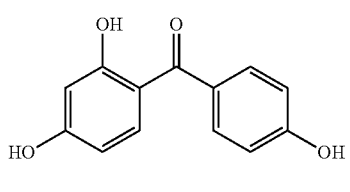 (1a-13)
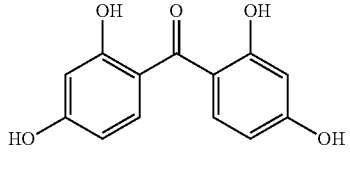 (1a-14)
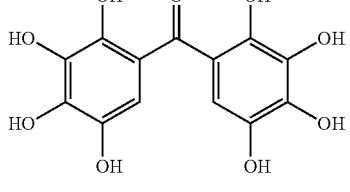 (1a-15)
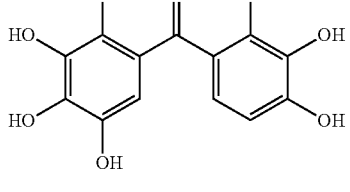 (1a-16)
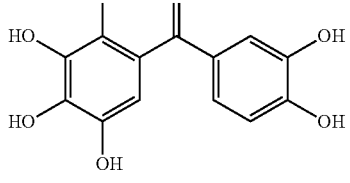 (1a-17)

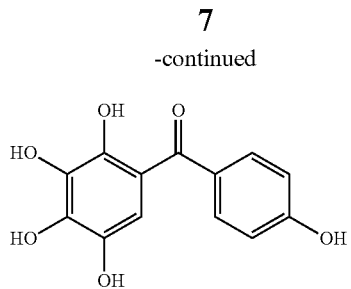
(1a-18)

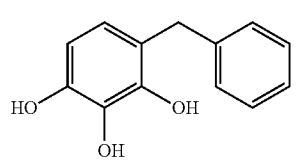
(1a-19)

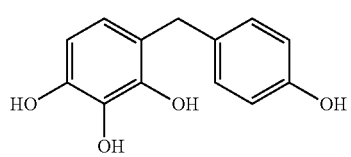
(1a-20)

For example, the compound of Formula (1a) is preferably 2,3,3',4,4',5'-hexahydroxybenzophenone, 2,2',4,4'-tetrahydroxybenzophenone, 2,3,4,4'-tetrahydroxybenzophenone, 2,3,4,-trihydroxydiphenylmethane, or 2,3,4,4'-tetrahydroxydiphenylmethane in terms of easy availability. The compound of Formula (1a) is more preferably a benzophenone derivative having a plurality of phenolic hydroxy groups in terms of improved resistance to an aqueous hydrogen peroxide solution.

Examples of the compound of Formula (1b) include compounds of Formula (1b-1) to (1b-15) described below.

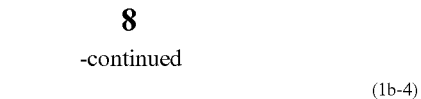
(1b-1)

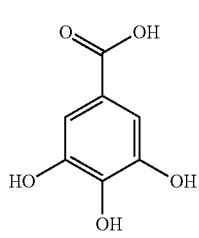
(1b-2)

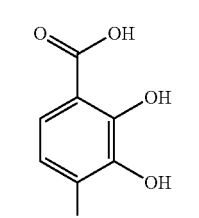
(1b-3)

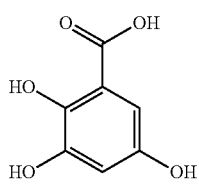
(1b-4)

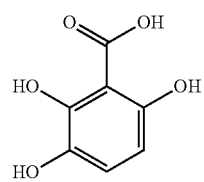
(1b-5)

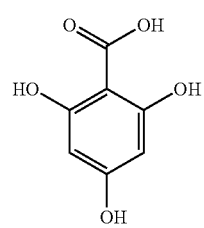
(1b-6)

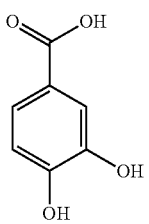
(1b-7)

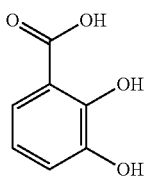
(1b-8)

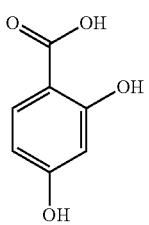
(1b-9)

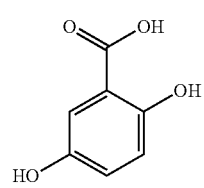
(1b-10)

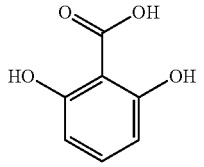
(1b-11)

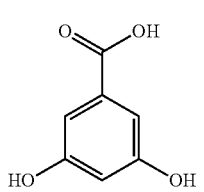

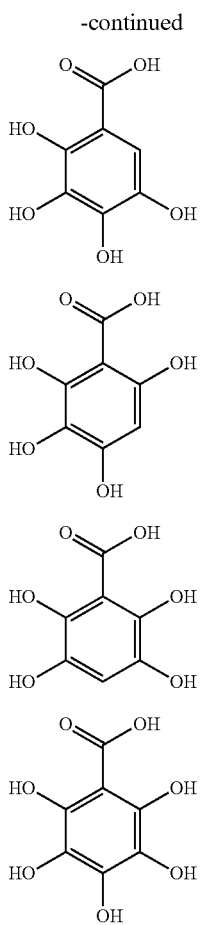

(1b-12)

(1b-13)

(1b-14)

(1b-15)

The resist underlayer film-forming composition of the present invention contains the compound of Formula (1a) or (1b), for example, in an amount of 0.01% by mass to 60% by mass, and preferably 0.1% by mas to 20% by mass, relative to the content of the resin. When the content of the compound of Formula (1a) or (1b) is less than 0.01% by mass, the effects of the present invention may not be obtained.

The resist underlayer film-forming composition of the present invention may contain a crosslinker as an optional component with the aforementioned compound. This crosslinker is also called crosslinkable compound. As the crosslinkable compound, a compound having at least two crosslinking forming substituents is preferably used. Examples thereof include a melamine-based compound, a substituted urea-based compound, and an aromatic compound that have at least two crosslinking forming substituents such as a hydroxymethyl group and an alkoxymethyl group, a compound having at least two epoxy groups, and a compound having at least two blocked isocyanate groups. Examples of the alkoxymethyl group include methoxymethyl group, 2-methoxyethoxymethyl group, and butoxymethyl group. As the crosslinkable compound, a nitrogen-containing compound having at least two, for example, two to four nitrogen atoms bonded to a hydroxymethyl group or an alkoxymethyl group is more preferably used. Examples of the nitrogen-containing compound include hexamethoxymethyl melamine, tetramethoxymethyl benzoguanamine, 1,3,4,6-tetrakis(methoxymethyl)glycoluril, 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, and 1,1,3,3-tetrakis(methoxymethyl)urea.

Examples of the aromatic compound having at least two hydroxymethyl groups or alkoxymethyl groups include 1-hydroxybenzene-2,4,6-trimethanol, 3,3',5,5'-tetrakis(hydroxymethyl)-4,4'-dihydroxybiphenyl (trade name: TML-BP, available from Honshu Chemical Industry Co., Ltd.), 5,5'-[2,2,2-trifluoro-1-(trifluoromethyl)ethylidene]bis [2-hydroxy-1,3-benzenedimethanol] (trade name: TML-BPAF-MF, available from Honshu Chemical Industry Co., Ltd.), 2,2-dimethoxymethyl-4-t-butylphenol (trade name: DMOM-PTBP, available from Honshu Chemical Industry Co., Ltd.), 3,3',5,5'-tetramethoxymethyl-4,4'-dihydroxybiphenyl (trade name: TMOM-BP, available from Honshu Chemical Industry Co., Ltd.), bis(2-hydroxy-3-hydroxymethyl-5-methylphenyl)methane (trade name: DM-BIPC-F, available from Asahi Organic Chemicals Industry Co., Ltd.), his(4-hydroxy-3-hydroxymethyl-5-methylphenyl)methane (trade name: DM-BEOC-F, available from Asahi Organic Chemicals Industry Co., Ltd.), and 2,2-bis(4-hydroxy-3,5-dihydroxymethylphenyl)propane (trade name: TM-BIP-A, available from Asahi Organic Chemicals Industry Co., Ltd.).

Examples of the compound having at least two epoxy groups include tris(2,3-epoxypropyl) isocyanurate, 1,4-butanediol diglycidyl ether, 1,2-epoxy-4-(epoxyethyl)cyclohexane, glycerol triglycidyl ether, diethylene glycol diglycidyl ether, 2,6-diglycidyl phenylglycidyl ether, 1,1,3-tris[p-(2,3-epoxypropoxy)phenyl]propane, 1,2-cyclohexanedicarboxylic acid diglycidyl ester, 4,4'-methylenebis(N,N-diglycidylaniline), 3,4-epoxycyclohexylmethyl-3,4-epoxycyclohexane carboxylate, trimethylolethane triglycidyl ether, bisphenol-A-diglycidyl ether, EPOLEAD® GT-401, GT-403, GT-301, and GT-302, and CELLOXIDE® 2021 and 3000 available from Daicel Corporation, 1001, 1002, 1003, 1004, 1007, 1009, 1010, 828, 807, 152, 154, 180S75, 871, and 872 available from Mitsubishi Chemical Corporation, EPPN201, and 202, and EOCN-102, 103S, 104S, 1020, 1025, and 1027 available from NIPPON KAYAKU Co., Ltd., DENACOL® EX-252, EX-611, EX-612, EX-614, EX-622, EX-411, EX-512, EX-522, EX-421, EX-313, EX-314, and EX-321 available from Nagase ChemteX Corporation, CY175, CY177, CY179, CY182, CY184, and CY192 available from BASF Japan Ltd., and EPICLON 200, 400, 7015, 835LV, and 850CRP available from DIC Corporation.

As the compound having at least two epoxy groups, a polymer compound may be also used. This polymer compound can be used without particular limitation as long as it is a polymer having at least two epoxy groups. The polymer compound can be produced by addition polymerization using an addition-polymerizable monomer having an epoxy group or a reaction of a polymer having a hydroxy group with a compound having an epoxy group such as epichlorohydrin and glycidyl tosylate. Examples of the polymer having at least two epoxy groups include addition polymerization polymers such as copolymers of polyglycidyl acrylate, glycidyl methacrylate, and ethyl methacrylate, and copolymers of glycidyl methacrylate, styrene, and 2-hydroxyethyl methacrylate, and condensation polymerization polymers such as epoxy novolac. For example, the polymer compound has a weight average molecular weight of 300 to 200,000. The weight average molecular weight is a value obtained by GPC using polystyrene as a standard sample.

As the compound having at least two epoxy groups, an epoxy resin having an amino group may be further used.

Examples of such an epoxy resin include YH-434 and YH-434L (all available from NSCC Epoxy Manufacturing Co., Ltd.).

Examples of the compound having at least two blocked isocyanate groups include TAKENATE® B-830 and B-870N available from Mitsui Chemicals, Inc., and VESTANAT®-B1358/100 available from Evonik Degussa GmbH.

The compound may be used alone, or two or more types thereof may be used in combination.

When the crosslinkable compound is used, the content of the crosslinkable compound is, for example, 1% by mass to 80% by mass, and preferably 5% by mass to 60% by mass, relative to the content of the resin. When the content of the crosslinkable compound is too small or too large, the resistance of a film to be formed to a resist solvent may not be sufficiently achieved.

The resist underlayer film-forming composition of the present invention may contain a crosslinking catalyst (acid catalyst) for promoting a crosslinking reaction as an optional component. As the crosslinking catalyst, for example, a sulfonic acid compound or a carboxylic acid compound, or a thermal acid generator may be used.

Examples of the sulfonic acid compound include p-toluenesulfonic acid, pyridinium p-teluenesulfonate, pyridinium-trifluoromethanesulfonic acid, 5-sulfosalicylic acid, 4-chlorobenzenesulfonic acid, 4-hydroxybenzenesulfonic acid, pyridinium 4-hydroxybenzenesulfonate, n-dodecylbenzenesulfonic acid, 4-nitrobenzenesulfonic acid, benzenedisulfonic acid, 1-naphthalenesulfonic acid, trifluoromethanesulfonic acid, and camphorsulfonic acid. Examples of the carboxylic acid compound include salicylic acid, citric acid, benzoic acid, and hydroxybenzoic acid. Examples of the thermal acid generator include K-PURE® CXC-1612, CXC-1614, TAG-2172, TAG-2179, TAG-2678, TAG2689, and TAG2700 (available from King Industries, Inc.), and SI-45, SI-60, SI-80, SI-100, SI-110, and SI-150 (available from SANSHIN CHEMICAL INDUSTRY CO., LTD.).

One type of the crosslinking catalyst may be used, or two or more types thereof may be used in combination. When the crosslinking catalyst is used, the content of the crosslinking catalyst is, thr example, 0.1% by mass to 20% by mass, and preferably 1% by mass to 10% by mass, relative to the content of the resin.

The resist underlayer film-forming composition of the present invention may contain a surfactant as an optional component to improve application properties to a substrate. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl aryl ethers such as polyoxyethylene octyl phenol ether and polyoxyethylene nonyl phenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorosurfactants including Eftop® EF301, EF303, and EF352 (available from Mitsubishi Materials Electronic Chemicals Co., Ltd.), MEGAFACE® F171, F173, R-30, R-30N, and R-40-LM (available from DIC Corporation), Fluorad FC430 and FC431 (available from Sumitomo 3M, Ltd.), AsahiGuard® AG710, and Susflon® S-382, SC101, SC102, SC103, SC104, SC105, and SC106 (available from Asahi Glass Co., Ltd.), and organosiloxane polymer KP341 (available from Shin-Etsu Chemical Co., Ltd.). The surfactant may be added alone, or two or more types thereof may be added in combination.

When the surfactant is used, the content of the surfactant is, for example, 0.01% by mass to 5% by mass, and preferably 0.1% by mass to 3% by mass, relative to the content of the resin.

The resist underlayer film-forming composition of the present invention can be prepared by dissolving the aforementioned components in an appropriate solvent. The resist underlayer film-forming composition is used in a homogeneous solution state. As such a solvent, for example, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropinoate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, or N-methylpyrrolidone may be used. The solvent may be used alone, or two or more types thereof may be used in combination. Further, a solvent having a high boiling point such as propylene glycol monobutyl ether or propylene glycol monobutyl ether acetate may be mixed in the aforementioned solvent, and the mixture may be used.

It is preferable that the prepared composition be used after filtration, for example, through a filter having a pore diameter of 0.2 μm, 0.1 μm, or 0.05 μm. The resist underlayer film-forming composition of the present invention has excellent storage stability at room temperature for an extended period of time.

Hereinafter, a method for forming a pattern using the resist underlayer film-forming composition of the present invention will be described.

According to the method for forming a pattern of the present invention, a pattern can be formed on a surface of a semiconductor substrate, an inorganic film on a semiconductor substrate, or the like.

Examples of a semiconductor substrate to which the resist underlayer film-forming composition of the present invention is applied include a silicon substrate, a germanium substrate, and a compound semiconductor wafer of gallium arsenide, indium phosphide, gallium nitride, indium nitride, aluminum nitride, and the like. When a semiconductor substrate having an inorganic film on the surface is used, the inorganic film is formed, for example, by an atomic layer deposition (ALD) process, a chemical vapor deposition (CVD) process, a reactive sputtering process, an ion plating process, a vacuum vapor deposition process, or a spin coating process (spin on glass: SOG). Examples of the inorganic film include a polysilicon film, a silicon oxide film, a silicon nitride film, a boro-phospho silicate glass (BPSG) film, a titanium nitride film, a titanium nitride oxide film, a tungsten film, a gallium nitride film, and a gallium arsenide film.

When the composition of the present invention is applied to the substrate having a recess by an appropriate coating method such as a spinner or a coater, and then baked with a heating means such as a hot plate, a resist underlayer film is formed. A baking condition is appropriately selected from a baking temperature of 80° C. to 350° C. and a baking time of 0.3 minutes to 10 minutes. It is preferable that the baking temperature be 120° C. to 300° C. and the baking time be 0.5 minutes to 5 minutes. The resist underlayer film has a thickness of 0.005 μm to 3.0 μm, for example, 0.01 μm to 0.1 μm or 0.05 μm to 0.5 μm.

When the baking temperature is lower than the aforementioned range, crosslinking is insufficient, and the resistance of the resist underlayer film to a resist solvent or an aqueous hydrogen peroxide solution may be insufficiently obtained. In contrast, when the baking temperature is higher than the aforementioned range, the resist underlayer film may be decomposed due to heat, and intermixing between the resist underlayer film and a resist film may occur.

Subsequently, a resist film is formed on the resist underlayer film. The resist film can be formed by a general method, that is, by applying a photoresist solution to the resist underlayer film, followed by baking.

The photoresist solution used in formation of the resist film is not particularly limited as long as it can be sensitive to light used in exposure, and a negative photoresist solution or a positive photoresist solution may be used.

In order to form a resist pattern, exposure through a mask (reticle) for formation of a predetermined pattern of the resist pattern is carried out. For example, a KrF excimer laser or an ArF excimer laser can be used for exposure. After exposure, post exposure bake is carried out, if necessary. A "post exposure bake" condition is appropriately selected from a heating temperature of 80° C. to 150° C. and a heating time of 0.3 minutes to 10 minutes. The resist pattern is then formed through a step of development with an alkaline developer.

Examples of the alkaline developer include an alkaline aqueous solution including an aqueous solution of an alkali metal hydroxide such as potassium hydroxide or sodium hydroxide, an aqueous solution of a quaternary ammonium hydroxide such as tetramethylammonium hydroxide, tetraethylammonium hydroxide, or choline, and an aqueous solution of an amine such as ethanolamine, propylamine, or ethylenediamine. Further, a surfactant or the like may be added to the developer. A development condition is appropriately selected from a development temperature of 5° C. to 50° C. and a development time of 10 seconds to 300 seconds.

Subsequently, the resist underlayer film is dry etched using the formed resist pattern as a mask. In this case, when the inorganic film is formed on the surface of the used semiconductor substrate, the surface of the inorganic film is exposed. When the inorganic film is not formed on the surface of the semiconductor substrate, the surface of the semiconductor substrate is exposed.

Wet etching with an aqueous hydrogen peroxide solution is carried out using the resist underlayer film after dry etching (including the resist pattern when the resist pattern remains on the resist underlayer film) as a mask, to form a desired pattern (for example, when the inorganic film is formed on the surface of the used semiconductor substrate, the desired pattern can be formed in the inorganic film, or when the inorganic film is not formed on the surface of the used semiconductor substrate, the desired pattern can be formed on the surface of the semiconductor substrate). Examples of a chemical solution for wet etching include a basic aqueous hydrogen peroxide solution in which a substance exhibiting basicity, for example, ammonia, sodium hydroxide, potassium hydroxide, sodium cyanide, potassium cyanide, or an organic amine such as triethanolamine is mixed with a hydrogen peroxide solution to make the pH basic, and an acidic aqueous hydrogen peroxide solution in which an inorganic acid such as hydrochloric acid or sulfuric acid is mixed with a hydrogen peroxide solution. Further, a substance capable of making the pH basic, for example, a substance that finally makes the pH basic by mixing urea with a hydrogen peroxide solution, and causing thermal decomposition of urea by heating, to generate ammonia can be used as the chemical solution for wet etching. The use temperature of the basic aqueous hydrogen peroxide solution and the acidic aqueous hydrogen peroxide solution is desirably 25° C. to 90° C., and further desirably 40° C. to 80° C. The wet etching time is desirably 0.1 minutes to 30 minutes, and further desirably 0.5 minutes to 15 minutes.

EXAMPLES

Hereinafter, specific examples of the resist underlayer film-forming composition of the present invention will be described with reference to the following Examples. The present invention is not limited to the Examples.

An apparatus and the like used in measurement of weight average molecular weight of reaction products obtained in the following Synthesis Examples are described.

Apparatus: HLC-8320GPC manufactured by TOSOH CORPORATION

GPC column: Asahipak® GF-310HQ, GF-510HQ, and GF-710HQ

Column temperature: 40° C.

Flow rate: 0.6 mL/min

Eluent: DMF

Standard sample: polystyrene

<Synthesis Example 1>

To 62.94 g of propylene glycol monomethyl ether (hereinafter abbreviated as PGME), 10.00 g of 1,6-bis(2,3-epoxypropan-1-yloxy)naphthalene (trade name: HP-4032D, available from DIC Corporation), 5.07 g of 3,3'-dithiodipropionic acid (trade name: DTDPA, available from SC Organic Chemical Co., Ltd.), and 0.67 g of ethyltriphenylphosphonium bromide as a catalyst were added, and a reaction was then caused at 105° C. for 24 hours to obtain a solution containing a reaction product. The obtained reaction product was analyzed by GPC. The weight average molecular weight thereof in terms of standard polystyrene was 3,000. The obtained reaction product is presumed to be a copolymer having a structural unit of the following Formula (2).

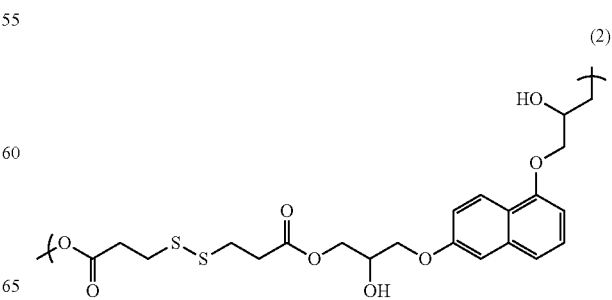

(2)

Synthesis Example 2

To 289.49 g of PGME, 15.00 g of 1,6-bis(2,3-epoxypropan-1-yloxy)naphthalene (trade name: HP-4032D, available from DIC Corporation), 23.10 g of monoallyl diglycidyl isocyanurate (trade mane: MA-DGIC, available from Shikoku Chemicals Corporation), 31.72 g of 3,3'-dithiodipropionic acid (trade name: DTDPA, available from SC Organic Chemical Co., Ltd.), and 2.55 g of ethyltriphenylphosphonium bromide as a catalyst were added, and a reaction was then caused at 105° C. for 24 hours to obtain a solution containing a reaction product. The obtained reaction product was analyzed by GPC. The weight average molecular weight thereof in terms of standard polystyrene was 3,300. The obtained reaction product is presumed to be a copolymer having the structural unit of the following Formula (3).

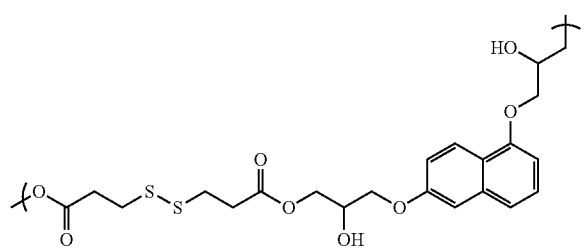

Synthesis Example 3

To 321.10 g of PGME, 16.00 g of 1,6-bis(2,3-epoxypropan-1-yloxy)naphthalene (trade name: HP-4032D, available from DIC Corporation), 24.64 g of monoallyl diglycidyl isocyanurate (trade mane: MA-DGIC, available from Shikoku Chemicals Corporation), 36.92 g of 3,3'-dithiodipropionic acid (trade name: DTDPA, available from SC Organic Chemical Co., Ltd.), and 2.72 g of ethyltriphenylphosphonium bromide as a catalyst were added, and a reaction was then caused at 105° C. for 24 hours to obtain a solution containing a reaction product. The obtained reaction product was analyzed by GPC. The weight average molecular weight thereof in terms of standard polystyrene was 2,300. The obtained reaction product is presumed to be a copolymer having a structural unit of Formula (3).

Synthesis Example 4

To 55.16 g of PGME, 5.00 g of ethyleneglycol diglycidyl ether (trade name: EPOLITE 40E, available from KYOEISHA CHEMICAL CO., LTD.), 8.09 g of 5-phenyl-5-ethylbarbituric acid, and 0.54 g of ethyltriphenylphosphonium bromide as a catalyst were added, and a reaction was caused under heating and reflux at 140° C. for 24 hours to obtain a solution containing a reaction product. The obtained reaction product was analyzed by GPC. The weight average molecular weight thereof in terms of standard polystyrene was 3,000. The obtained reaction product is presumed to be a copolymer having the structural unit of the following Formula (4).

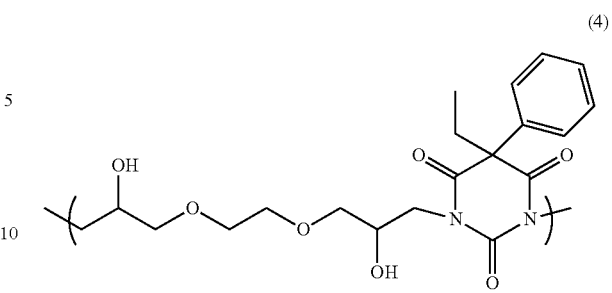

Synthesis Example 5

To 59.76 g of PGME, 7.00 g of 1,4-butanediol diglycidyl ether (trade name: 1,4-BD-DEP(P), available from Toyo fine chemical Co., Ltd,), 7.10 g of monoallyl isocyanurate (trade mane: MAICA, available from Shikoku Chemicals Corporation), 0.19 g of hydroquinone (available from Tokyo Chemical Industry Co., Ltd.) as a radical-trapping agent, and 0.65 g of ethyltriphenylphosphonium bromide as a catalyst were added, and a reaction was then caused under heating and reflux at 140° C. for 6 hours to obtain a solution containing a reaction product. The obtained reaction product was analyzed by GPC. The weight average molecular weight thereof in terms of standard polystyrene was 5,000. The obtained reaction product is presumed to be a copolymer having a structural unit of the following Formula (5).

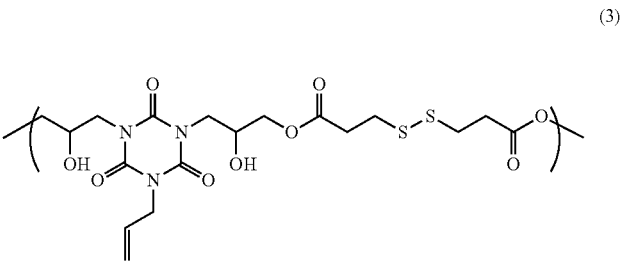

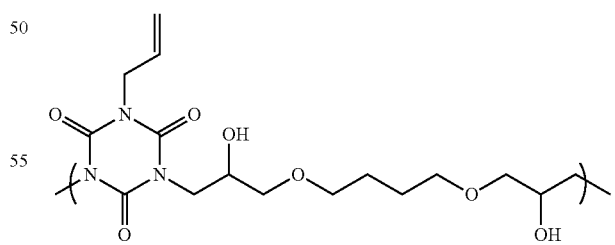

Synthesis Example 6

To 132.74 g of PGME, 6.00 g of ethyleneglycol diglycidyl ether (trade name: EPOLITE 40E, available from KYOEISHA CHEMICAL CO., LTD.), 11.36 g bisphenol F diglycidyl ether (trade name: RE-303S-L, available from NIPPON KAYAKU Co., Ltd.), 14.14 g of monoallyl isocyanurate (trade mane: MAICA, available from Shikoku Chemicals Corporation), 0.38 g of hydroquinone (available from Tokyo Chemical Industry Co., Ltd.) as a radical-trapping agent, and 1.29 g of ethyltriphenylphosphonium bromide as a catalyst were added, and a reaction was then caused under heating and reflux at 140° C. for 6 hours to obtain a solution containing a reaction product. The obtained reaction product was analyzed by GPC. The weight average molecular weight thereof in terms of standard polystyrene was 8,500. The obtained reaction product is presumed to be a copolymer having a structural unit of the following Formula (6).

monoallyl isocyanurate (trade mane: MAICA, available from Shikoku Chemicals Corporation), 0.12 g of hydroquinone (available from Tokyo Chemical Industry Co., Ltd.) as a radical-trapping agent, and 0.52 g ethyltriphenylphosphonium bromide as a catalyst were added, and a reaction was then caused under heating and reflux at 140° C. for 6 hours to obtain a solution containing a reaction product. The solution was subjected to reprecipitation using isopropyl alcohol. The obtained reaction product was analyzed by GPC. The weight average molecular weight thereof in terms

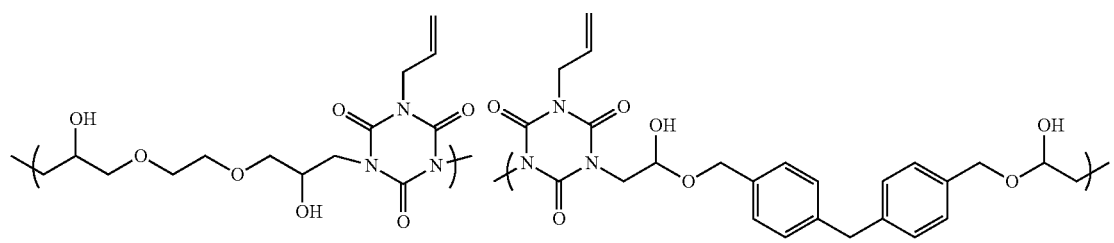

(6)

Synthesis Example 7

To 79.32 g of PGME, 10.00 g of 1,4-butanediol diglycidyl ether (trade name: 1,4-BD-DEP(P), available from Toyo fine chemical Co., Ltd.), 21.31 g of isopropylidenebis(2-allyl-4,1-phenylene)bis(glycidyl ether) (trade name: RE-810NM, available from NIPPON KAYAKU Co., Ltd.), 18.61 g of monoallyl isocyanurate (trade name: MAICA, available from Shikoku Chemicals Corporation), 0.55 g of hydroquinone (available from Tokyo Chemical Industry Co., Ltd.) as a radical-trapping agent, and 2.41 g of ethyltriphenylphosphonium bromide as a catalyst were added, and a reaction was then caused under heating and reflux at 140° C. for 6 hours to obtain a solution containing a reaction product. The obtained reaction product was analyzed by GPC. The weight average molecular weight thereof in terms of standard polystyrene was 23,500. The obtained reaction product is presumed to be a copolymer having a structural unit of the following Formula (7).

of standard polystyrene was 20,000. The obtained reaction product is presumed to be a copolymer having the structural unit of Formula (7).

[Preparation of Resist Underlayer Film-Forming Composition]

Example 1

In 19.76 g of solution containing 3.17 g of the copolymer obtained in Synthesis Example 1 (a solvent was PGME used during synthesis), 41.06 g of PGME, 0.48 g of tetramethoxymethyl glycoluril (trade name: POWDERLINK 1174, available from Nihon Cytec Industries Inc.), 0.079 g of 5-sulfosalicylic acid (available from Tokyo Chemical Industry Co., Ltd.), 0.48 g of gallic acid hydrate (available from Tokyo Chemical Industry Co., Ltd.), and 0.0032 g of surfactant (trade name: R-30N, available from DIC Corporation) were mixed to obtain a 6.0% by mass solution. The solution was filtered through a polytetrafluoroethylene

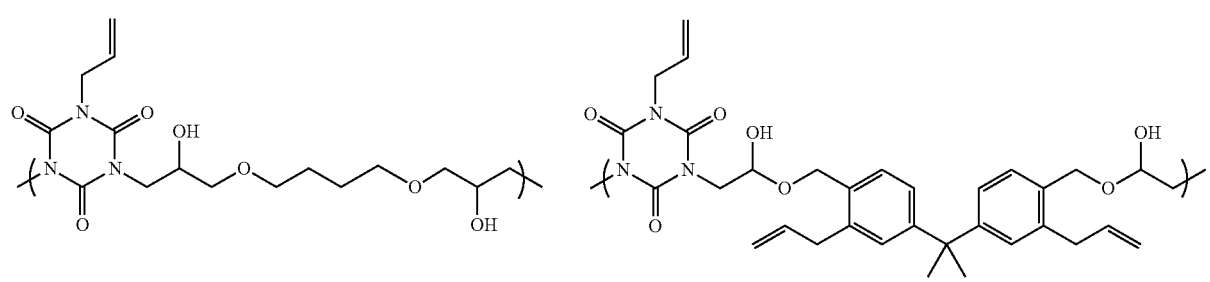

(7)

Synthesis Example 8

To 15.54 g of PGME, 3.00 g of 1,4-butanediol diglycidyl ether (trade name: 1,4-BD-DEP(P), available from Toyo fine chemical Co., Ltd.), 2.74 g of isopropylidenebis(2-allyl-4,1-phenylene)bis(glycidyl ether) (trade name: RE-810NM, available from NIPPON KAYAKU Co., Ltd.), 3.99 g of microfilter having a pore diameter of 0.2 μm to prepare a resist underlayer film-forming composition.

Example 2

In 13.44 g of solution containing 2.16 g of the copolymer obtained in Synthesis Example 2 (a solvent was PGME used during synthesis), 15.35 g of PGME, 0.11 g of tetramethoxymethyl glycoluril (trade name: POWDERLINK 1174, available from Nihon Cytec Industries Inc.), 0.11 g of 5-sulfosalicylic acid (available from Tokyo Chemical Industry Co., Ltd.), 0.11 g of gallic acid hydrate (available from Tokyo Chemical industry Co., Ltd.), and 0.0022 g of surfactant (trade name: R-30N, available from DIC Corporation) were mixed to obtain a 6.2% by mass solution. The solution was filtered through a polytetrafluoroethylene microfilter having a pore diameter of 0.2 µm to prepare a resist underlayer film-forming composition.

Example 3

In 3.25 g of solution containing 0.54 g of the copolymer obtained in Synthesis Example 2 (a solvent was PGME used during synthesis), 6.10 g of PGME, 0.027 g of tetramethoxymethyl glycoluril (trade name: POWDERLINK 1174, available from Nihon Cytec Industries Inc.), 0.027 g of 5-sulfosalicylic acid (available from Tokyo Chemical Industry Co., Ltd.), 0.027 g of 2,3,3',4,4',5'-hexahydroxybenzophenone (available from Tokyo Chemical Industry Co., Ltd.), and 0.00054 g of surfactant (trade name: R-30N, available from DIC Corporation) were mixed to obtain a 6.2% by mass solution. The solution was filtered through a polytetrafluoroethylene microfilter having a pore diameter of 0.2 µm to prepare a resist underlayer film-forming composition.

Example 4

In 16.79 g of solution containing 2.85 g of the copolymer obtained in Synthesis Example 2 (a solvent was PGME used during synthesis), 32,96 g of PGME, 0.11 g of pyridinium trifluoromethanesulfonate (available from Tokyo Chemical Industry Co., Ltd.), 0.14 g of gallic acid hydrate (available from Tokyo Chemical industry Co., Ltd.), and 0.0028 g of surfactant (trade name: R-30N, available from DIC Corporation) were mixed to obtain a 6.2% by mass solution. The solution was filtered through a polytetrafluoroethylene microfilter having a pore diameter of 0.2 µm to prepare a resist underlayer film-forming composition.

Example 5

In 3.31 g of solution containing 0.56 g of the copolymer obtained in Synthesis Example 2 (a solvent was PGME used during synthesis), 6.61 g of PGME, 0.021 g of pyridinium trifluoromethanesulfonate (available from Tokyo Chemical Industry Co., Ltd.), 0.056 g of gallic acid hydrate (available from Tokyo Chemical Industry Co., Ltd.), and 0.00056 g of surfactant (trade name: R-30N, available from DIC Corporation) were mixed to obtain a 6.4% by mass solution. The solution was filtered through a polytetrafluoroethylene microfilter having a pore diameter of 0.2 µm to prepare a resist underlayer film-forming composition.

Example 6

In 7.05 g of solution containing 1.12 g of the copolymer obtained in Synthesis Example 3 (a solvent was PGME used during synthesis), 12.80 g of PGME, 0.042 g of pyridinium trifluoromethanesulfonate (available from Tokyo Chemical Industry Co., Ltd.), 0.11 g of gallic acid hydrate (available from Tokyo Chemical Industry Co., Ltd.), and 0.0011 g of surfactant (trade name: R-30N, available from DIC Corporation) were mixed to obtain a 6.4% by mass solution. The solution was filtered through a polytetrafluoroethylene microfilter having a pore diameter of 0.2 µm to prepare a resist underlayer film-forming composition.

Example 7

In 3.44 g of solution containing 0.57 g of the copolymer obtained in Synthesis Example 2 (a solvent was PGME used during synthesis), 6.51 g of PGME, 0.021 g of pyridinium trifluoromethanesulfonate (available from Tokyo Chemical Industry Co., Ltd.), 0.029 g of 2,3,3',4,4',5'-hexahydroxybenzophenone (available from Tokyo Chemical Industry Co., Ltd.), and 0.00056 g of surfactant (trade name: R-30N, available from DIC Corporation) were mixed to obtain a 6.2% by mass solution. The solution was filtered through a polytetrafluoroethylene microfilter having a pore diameter of 0.2 µm to prepare a resist underlayer film-forming composition.

Example 8

In 3.34 g of solution containing 0.56 g of the copolymer obtained in Synthesis Example 4 (a solvent was PGME used during synthesis), 5.56 g of PGME, 0.93 g of propylene glycol monomethyl ether acetate (hereinafter abbreviated as PGMEA), 0.14 g of tetramethoxymethyl glycoluril (trade name: POWDERLINK 1174 available from Nihon Cytec Industries Inc.), 0.0056 g of K-PURE® TAG2689 (available from King Industries, Inc.), 0.028 g of gallic acid hydrate (available from Tokyo Chemical Industry Co., Ltd.), and 0.00056 g of surfactant (trade name: R-30N available from DIC Corporation) were mixed to obtain a 7.3% by mass solution. The solution was filtered through a polytetrafluoroethylene microfilter having a pore diameter of 0.2 µm to prepare a resist underlayer film-forming composition.

Example 9

In 2.97 g of solution containing 0.51 g of the copolymer obtained in Synthesis Example 5 (a solvent was PGME used during synthesis), 5.91 g of PGME, 0.93 g of PGMEA, 0.13 g of 3,3',5,5'-tetramethoxymethyl-4,4'-dihydroxybiphenyl (trade name: TMOM-BP, available from Honshu Chemical Industry Co., Ltd.), 0.013 g of K-PURE® TAG2689 (available from King Industries, Inc.), 0.051 g of gallic acid hydrate (available from Tokyo Chemical Industry Co., Ltd.), and 0.00051 g of surfactant (trade name: R-30N, available from DIC Corporation) were mixed to obtain a 7.0% by mass solution. The solution was filtered through a polytetrafluoroethylene microfilter having a pore diameter of 0.2 µm to prepare a resist underlayer film-forming composition.

Example 10

In 7.03 g of solution containing 1.19 g of the copolymer obtained in Synthesis Example 6 (a solvent was PGME used during synthesis), 5.91 g of PGME, 0.93 g of PGMEA, 0.24 g of tetramethoxymethyl glycoluril (trade name: POWDERLINK 1174, available from Nihon Cytec Industries Inc.), 0.018 g of pyridinium trifluoromethanesulfonate (available from Tokyo Chemical Industry Co., Ltd.), 0.059 g of gallic acid hydrate (available from Tokyo Chemical industry Co., Ltd.), and 0.0012 g of surfactant (trade name: R-30N, available from DIC Corporation) were mixed to obtain a 7.5% by mass solution. The solution was filtered through a polytetrafluoroethylene microfilter having a pore diameter of 0.2 μm to prepare a resist underlayer film-forming composition, Example 11

In 2.97 g of solution containing 0.51 g of the copolymer obtained in Synthesis Example 7 (a solvent was PGME used during synthesis), 6.02 g of PGME, 0.95 g of PGMEA, 0.051 g of gallic acid hydrate (available from Tokyo Chemical Industry Co., Ltd.), and 0.00051 g of surfactant (trade name: R-30N, available from DIC Corporation) were mixed to obtain a 5.2% by mass solution. The solution was filtered through a polytetrafluoroethylene microfilter having a pore diameter of 0.2 μm to prepare a resist underlayer film-forming composition.

Example 12

In 0.53 g of the copolymer obtained in Synthesis Example 8, 8.51 g of PGME, 0.95 g of PGMEA, 0.053 g of gallic acid hydrate (available from Tokyo Chemical Industry Co., Ltd.), and 0.00053 g of surfactant (trade name: R-30N, available from DIC Corporation) were mixed to obtain a 5.4% by mass solution. The solution was filtered through a polytetrafluoroethylene microfilter having a pore diameter of 0.2 μm to prepare a resist underlayer film-forming composition.

Comparative Example 1

In 3.17 g of solution containing 0.53 g of the copolymer obtained in Synthesis Example 1 (a solvent was PGME used during synthesis), 4.49 g of PGME, 0.89 g of PGMEA, 0.079 g of tetramethoxymethyl glycoluril (trade name: POWDERLINK 1174, available from Nihon Cytec Industries Inc.), 0.013 g of 5-sulfosalicylic acid (available from Tokyo Chemical Industry Co., Ltd.) and 0.00013 g of surfactant (trade name: R-30N, available from DIC Corporation) were mixed to obtain a 6.2% by mass solution. The solution was filtered through a polytetrafluoroethylene microfilter having a pore diameter of 0.2 μm to prepare a resist underlayer film-forming composition. This Comparative Example is an example in which the compound of Formula (1a) or (1b) is not contained.

Comparative Example 2

In 3.40 g of solution containing 0.56 g of the copolymer obtained in Synthesis Example 2 (a solvent was PGME used during synthesis), 5.96 g of PGME, 0.028 g of tetramethoxymethyl glycoluril (trade name: POWDERLINK 1174, available from Nihon Cytec Industries Inc.), 0.028 g of 5-sulfosalicylic acid (available from Tokyo Chemical industry Co., Ltd.), and 0.00056 g of surfactant (trade name: R-30N, available from DIC Corporation) were mixed to obtain a 6.2% by mass solution. The solution was filtered through a polytetrafluoroethylene microfilter having a pore diameter of 0.2 μm to prepare a resist underlayer film-forming composition. This Comparative Example is also an example in which the compound of Formula (1a) or (1b) is not contained.

[Elution Test into Photoresist Solvent]

The resist underlayer film-forming composition prepared in each of Examples 1 to 12 and Comparative Examples 1 and 2 was applied to a silicon wafer with a spinner, and then baked on a hot plate at a temperature shown in Table 1 for 1 minute to form a resist underlayer film (thickness: 0.2 μm). The resist underlayer films were each immersed in PGME and. PGMEA that were a solvent used for a photoresist solution. It was confirmed that the resist underlayer films were insoluble in both the solvents. The resist underlayer films were each immersed in an alkaline developer for photoresist development (2.38% by mass tetramethylammonium hydroxide aqueous solution). It was confirmed that the resist underlayer film was insoluble in the developer.

[Test of Optical Parameter]

The resist underlayer film-forming composition prepared in each of Examples 1 to 12 and Comparative Examples 1 and 2 was applied to a silicon wafer with a spinner, and then baked on a hot plate at a temperature shown in Table 1 for 1 minute to form a resist underlayer film (thickness: 0.2 μm). The refractive index (n value) and extinction coefficient (k value) of the resist underlayer films were measured at wavelengths of 193 and 248 nm using an optical ellipsometer (VUV-VASE VU-302 manufactured by J. A. Woollam Co.). The results are shown in Table 1. It is desirable that the resist underlayer film have a k value of 0.1 or more at a wavelength of 193 nm or 248 nm to exhibit sufficient anti-reflection function.

TABLE 1

| | Baking temperature (° C.) | Optical parameter | | | | APM resistance | Litho-character-istics | Embedd-ability |
| | | 193 nm | | 248 nm | | | | |
| | | n value | k value | n value | k value | | | |
|---|---|---|---|---|---|---|---|---|
| Example 1 | 250 | 1.65 | 0.19 | 1.82 | 0.31 | ○ | ○ | ○ |
| Example 2 | 250 | 1.79 | 0.23 | 1.75 | 0.16 | ○ | ○ | ○ |
| Example 3 | 250 | 1.79 | 0.25 | 1.76 | 0.15 | ○ | ○ | ○ |
| Example 4 | 250 | 1.85 | 0.24 | 1.74 | 0.15 | ○ | ○ | ○ |
| Example 5 | 250 | 1.84 | 0.24 | 1.74 | 0.15 | ○ | ○ | ○ |
| Example 6 | 250 | 1.85 | 0.24 | 1.74 | 0.15 | ○ | ○ | ○ |
| Example 7 | 250 | 1.83 | 0.25 | 1.74 | 0.15 | ○ | ○ | ○ |
| Example 8 | 250 | 1.72 | 0.47 | 1.75 | 0.03 | ○ | ○ | ○ |
| Example 9 | 215 | 1.81 | 0.33 | 1.70 | 0.06 | ○ | ○ | ○ |
| Example 10 | 250 | 1.81 | 0.56 | 1.76 | 0.01 | ○ | ○ | ○ |
| Example 11 | 300 | 1.73 | 0.44 | 1.75 | 0.03 | ○ | ○ | ○ |
| Example 12 | 300 | 1.76 | 0.40 | 1.72 | 0.03 | ○ | ○ | ○ |
| Comparative Example 1 | 250 | 1.68 | 0.18 | 1.81 | 0.29 | x | ○ | x |
| Comparative Example 2 | 250 | 1.82 | 0.24 | 1.75 | 0.15 | x | ○ | x |

[Test of Resistance to Basic Aqueous Hydrogen Peroxide Solution]

The resist underlayer film-forming composition prepared in each of Examples 1 to 12 and Comparative Examples 1 and 2 was applied to a silicon substrate having a titanium nitride film on a surface with a spinner, and then baked on a hot plate at a temperature shown in Table 1 for 1 minute to form a resist underlayer film (thickness: 0.2 μm). The resist underlayer film formed on the silicon substrate was immersed in a basic aqueous hydrogen peroxide solution having a composition shown in Table 2 described below (in Table 1, abbreviated as APM) at a temperature shown in Table, and the time required to peel the resist underlayer film from the silicon substrate was measured. Thus, APM resistance was evaluated. The results are shown in Table 1. In Table 1, "O" represents a state where peeling of the resist underlayer film is not observed after immersion for 1 minute, and "x" represents a state where peeling of a part or whole of the resist underlayer film is observed after immersion for 1 minute.

TABLE 2

| Composition of Basic Aqueous Hydrogen Peroxide Solution and Treatment Temperature | | | |
|---|---|---|---|
| 28% by mass aqueous ammonia solution | 33% by mass aqueous hydrogen peroxide solution | Water | Temperature |
| 10 mL | 10 mL | 20 mL | 50□ |

[Evaluation of Photoresist Pattern Shape]

The resist underlayer film-forming composition prepared in each of Examples 1 to 12 and Comparative Examples 1 and 2 was applied to a silicon wafer with a spinner, and then baked on a hot plate at a temperature shown in Table 1 for 1 minute to form a resist underlayer film (thickness: 0.2 μm). A commercially available photoresist solution (trade name: AR2772 available from JSR Corporation) was applied to the resist underlayer film with a spinner, and baked on a hot plate at 110° C. for 90 seconds, to form a photoresist film (thickness: 0.2 μm).

Subsequently, exposure was carried out with a scanner NSRS307E manufactured by Nikon Corporation (wavelength: 193 nm, NA: 0.85, σ: 0.62/0.93 (ANNULAR)) through a photomask prepared so as to form 100 lines of photoresist having a width of 0.10 μm at intervals of 0.10 μm between the lines of photoresist, that was, having line and space widths of 0.10 μm L/S (dense line), after development. Post exposure bake (PEB) was then carried out on a hot plate at 110° C. for 90 seconds. After cooling, the photoresist film was developed by a 0.26 N tetramethylammonium hydroxide aqueous solution as a developer by a 60-second single puddle process in accordance with Industrial Standard, to obtain a photoresist pattern.

Cross-sections of the obtained photoresist patterns in a direction perpendicular to the substrate, that was, the silicon wafer were observed with a scanning electron microscope (SEM), and lithography characteristics (in Table 1, abbreviated as litho-characteristics) were evaluated. According to the results of observation, the cross-sectional shapes of all the photoresist patterns were a favorable straight skirt shape. that was, a substantially rectangular shape. SEM images of the cross-sections of the photoresist patterns finally formed on the resist underlayer films from the resist underlayer film-forming compositions prepared in Examples 1 to 12 and Comparative Examples 1 and 2 are shown in FIG. 1. In Table 1, "O" represents a state where the photoresist pattern is formed without collapse, and "x" represents a state where the photoresist pattern collapses.

[Test of Embeddability (Filling Properties)]

The resist underlayer film-forming composition in each of Examples 1 to 12 and Comparative Examples 1 and 2 was applied to a silicon wafer having a plurality of trenches (width: 0.01 depth: 0.23 μm) and an SiO$_2$ film on a surface (hereinafter abbreviated as SiO$_2$ wafer) with a spinner, and then baked on a hot plate at a temperature shown in Table 1 for 1 minute to form a resist underlayer film (thickness; 0.2 μm).

Figure 2:
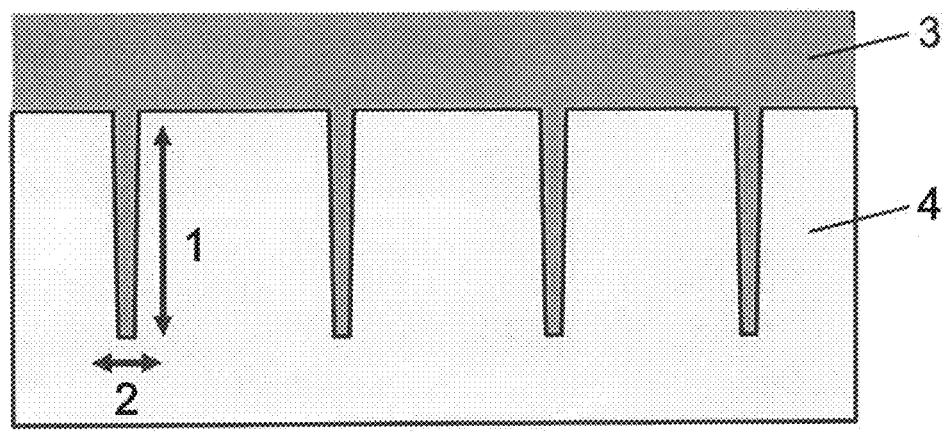
FIG. 2 is a schematic view illustrating a cross section of a $SiO_2$ wafer used in a test of embeddability of a resist underlayer film in a trench (filling properties).

FIG. 2 is a schematic view of a SiO$_2$ wafer 4 used in this test and an underlayer film 3 formed on the wafer. The SiO$_2$ wafer 4 has trenches in a dense pattern (Dense). The dense pattern is a pattern in which the distance between the center of each trench and the center of each adjacent trench is 10 times the trench width. As shown in FIG. 2, a depth 1 of the trench of the SiO$_2$ wafer 4 is 0.23 μm and a width 2 of the trench is 0.01 μm.

Figure 3:
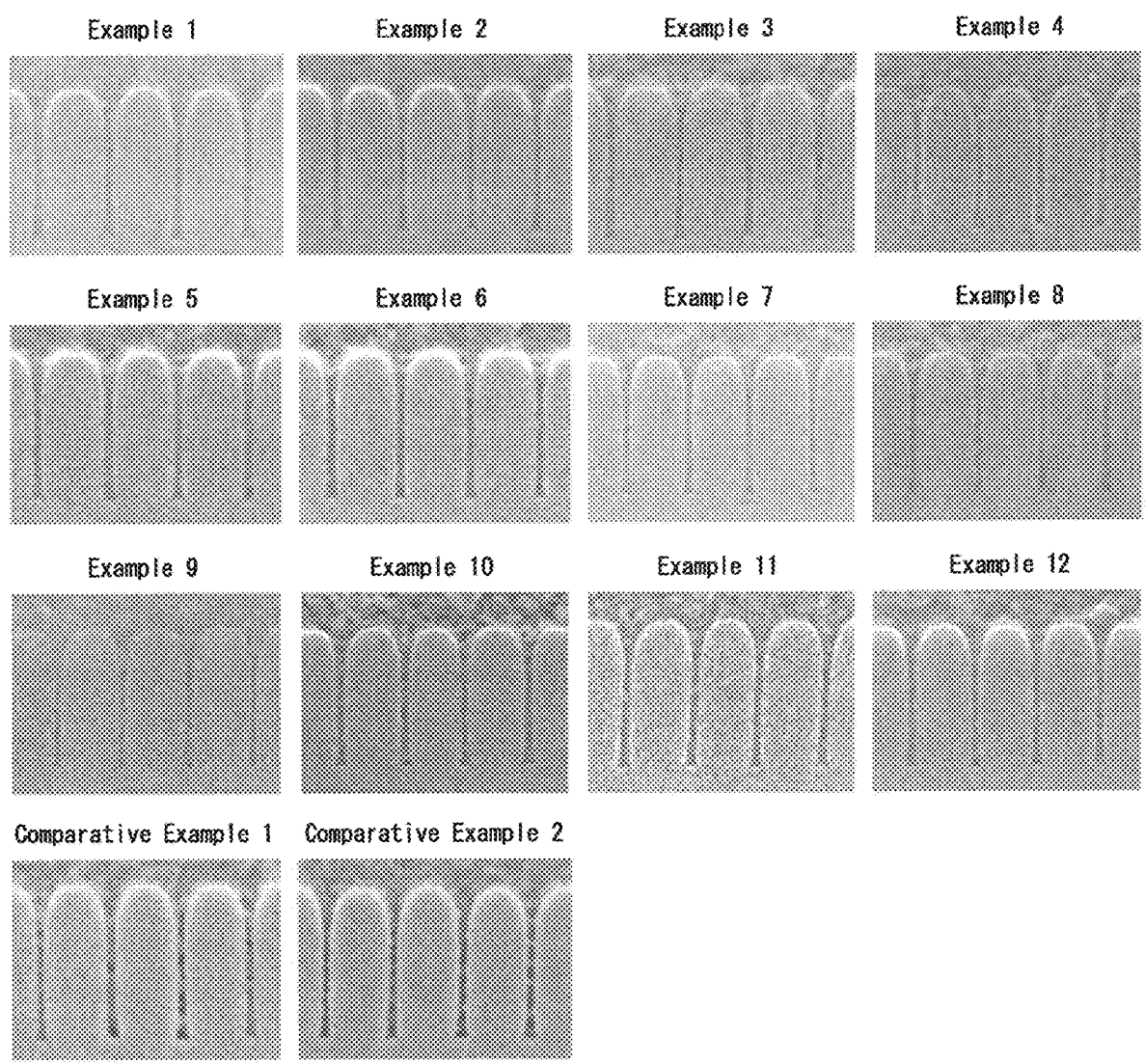
FIG. 3 is cross-sectional SEM images of $SiO_2$ wafers on which resist underlayer films are formed from resist underlayer film-forming compositions prepared in Examples 1 to 12, and Comparative Examples 1 and 2.

As described above, the cross-sectional shape of the SiO$_2$ wafer on which a resist underlayer film was formed from the resist underlayer film-forming composition in each of Examples 1 to 12 and Comparative Examples 1 and 2 was observed with a scanning electron microscope (SEM). The embeddability of the resist underlayer film (filling properties) in trenches of the SiO$_2$ wafer was evaluated. The obtained results are shown in FIG. 3. When the resist underlayer film was formed on the SiO$_2$ wafer from the resist underlayer film-forming composition in each of Examples 1 to 12, voids (gaps) in the trenches were not observed, the inside of the trenches was filled with the resist underlayer film, and the resist underlayer film that was completely embedded in the whole trenches was observed. When the resist underlayer film was formed on the SiO$_2$ wafer from the resist underlayer film-forming composition in each of Comparative Examples 1 and 2, voids (gaps) in the trenches were observed, the inside of the trenches was not filled with the resist underlayer film, and the resist underlayer film that was not completely embedded in the whole trenches were observed. In Table 1, "O" represents a state where voids in the trenches are not observed, and "x" represents a state where voids in the trenches are observed.

The results shown in Table 1 show that the resist underlayer films formed from the resist underlayer film-forming compositions prepared in Examples 1 to 12 and Comparative Examples 1 and 2 have a k value of more than 0.1 at 193 nm or 248 nm. This shows that anti-reflection function is achieved by an exposure process using any of light sources of an ARF excimer laser and a KrF excimer laser.

The results show that the resist underlayer films formed from the resist underlayer film-forming compositions prepared in Examples 1 and 12 have sufficient resistance to a basic aqueous hydrogen peroxide solution. This shows that the coating films can be a protective film against the basic aqueous hydrogen peroxide solution. On the other hand, as clear from the results, the resist underlayer films formed from the resist underlayer film-forming compositions prepared in Comparative Examples 1 to 2 have no resistance to the basic aqueous hydrogen peroxide solution. This shows that the coating films cannot be a protective film against the basic aqueous hydrogen peroxide solution.

For the resist underlayer films formed on the SiO$_2$ wafer from the resist underlayer film-forming compositions in Examples 1 to 12, voids (gaps) in the trenches were not observed, the inside of the trenches was filled with the resist underlayer film, and the resist underlayer film that was completely embedded in the whole trenches was observed. On the other hand, for the resist underlayer film formed from the resist underlayer film-forming compositions in Comparative Examples 1 and 2, voids (gaps) in the trenches were observed, the inside of the trenches was not filled with the resist underlayer film, and the resist underlayer film that was not completely embedded in the whole trenches was observed.

DESCRIPTION OF SYMBOLS

1 Depth of trench of $SiO_2$ wafer
2 Width of trench of SiO2 wafer
3 Resist underlayer film
4 $SiO_2$ wafer

The invention claimed is:

1. A resist underlayer film-forming composition containing
  a resin, wherein the resin is selected from the group consisting of a polyester, a polyether, a novolac resin, and a maleimide resin, and excluding acrylic resin and methacrylic resin,
  a compound of Formula (1a) or (1b):

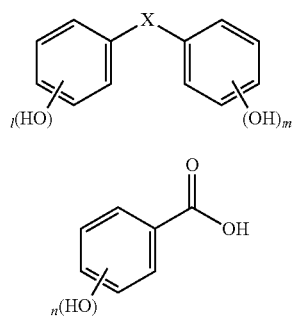

wherein X is a carbonyl group or a methylene group, 1 and m are each independently an integer of 0 to 5 and satisfy a relational expression of 3≤1+m 10, and n is an integer of 2 to 5, wherein in at least one benzene ring of the compound of Formula (1a), a phenolic hydroxy group is positioned at two or more adjacent carbon atoms, and in a benzene ring of the compound of Formula (1b), a phenolic hydroxy group is positioned at two or more adjacent carbon atoms, and
  a solvent,
    wherein the compound of Formula (1a) or (1b) is contained in an amount of 0.01% by mass to 60% by mass relative to the amount of the resin in the composition.

2. The resist underlayer film-forming composition according to claim 1, wherein in the compound of Formula (1a), 1 and m are each 3, and in the compound of Formula (1b), n is 3.

3. The resist underlayer film-forming composition according to claim 1, wherein the resin is a copolymer having no substituent containing an epoxy ring or an oxetane ring.

4. A method for manufacturing a semiconductor element comprising the steps of:
  applying the resist underlayer film-forming composition according to claim 1 to a semiconductor substrate having a surface having a recess and optionally having an inorganic film on the surface;
  baking the resist underlayer film-forming composition to form a resist underlayer film in at least the recess; and
  forming a resist pattern on the resist underlayer film.

5. The method for manufacturing a semiconductor element according to claim 4, wherein the semiconductor substrate has a trench having a width of 0.001 µm to 0.10 µm and an aspect ratio of 1 to 100.

6. A method for forming a pattern comprising the steps of:
  forming a resist underlayer film from the resist underlayer film-forming composition according to claim 1 on a semiconductor substrate optionally having an inorganic film on a surface;
  forming a resist pattern on the resist underlayer film;
  dry etching the resist underlayer film using the resist pattern as a mask to expose the inorganic film or a surface of the semiconductor substrate; and
  wet etching the inorganic film or the semiconductor substrate with an aqueous hydrogen peroxide solution using the resist underlayer film after the dry etching as a mask and washing the inorganic film or the semiconductor substrate.

* * * * *